(12) United States Patent
Fort

(10) Patent No.: US 7,719,341 B2
(45) Date of Patent: May 18, 2010

(54) MOS RESISTOR WITH SECOND OR HIGHER ORDER COMPENSATION

(75) Inventor: Jimmy Fort, Aix en Provence (FR)

(73) Assignee: ATMEL Corporation, San Jose, CA (US)

( * ) Notice: Subject to any disclaimer, the term of this patent is extended or adjusted under 35 U.S.C. 154(b) by 123 days.

(21) Appl. No.: 11/924,516

(22) Filed: Oct. 25, 2007

(65) Prior Publication Data

US 2009/0108913 A1 Apr. 30, 2009

(51) Int. Cl.
*H01L 35/00* (2006.01)
*H01L 37/00* (2006.01)

(52) U.S. Cl. ..................... 327/513; 327/539

(58) Field of Classification Search ......... 327/512–513, 327/539; 323/315
See application file for complete search history.

(56) References Cited

U.S. PATENT DOCUMENTS

| 4,622,476 | A | 11/1986 | Venkatesh | |
| 5,783,936 | A * | 7/1998 | Girard et al. | 323/315 |
| 5,801,596 | A | 9/1998 | Sakurai | |
| 5,999,063 | A | 12/1999 | Sakurai et al. | |
| 6,091,286 | A | 7/2000 | Blauschild | |
| 6,107,868 | A * | 8/2000 | Diniz et al. | 327/543 |
| 6,388,507 | B1 | 5/2002 | Hwang et al. | |
| 6,563,371 | B2 * | 5/2003 | Buckley et al. | 327/539 |
| 6,717,449 | B2 | 4/2004 | Tamiya et al. | |
| 7,049,875 | B2 | 5/2006 | Tsividis | |
| 7,057,444 | B2 * | 6/2006 | Illegems | 327/541 |
| 7,064,601 | B2 | 6/2006 | Kwak et al. | |
| 2002/0180544 | A1 | 12/2002 | Fukayama et al. | |
| 2006/0197581 | A1 * | 9/2006 | Chun et al. | 327/512 |

* cited by examiner

*Primary Examiner*—Quan Tra
(74) *Attorney, Agent, or Firm*—Fish & Richardson P.C.

(57) ABSTRACT

A circuit arrangement (e.g., an integrated circuit) generates a second or higher order compensation voltage to compensate for variations in operation parameters (e.g., temperature and process variations). In one aspect, the compensation voltage is applied to a MOS resistor to compensate for mobility variations of the MOS resistor by maintaining a stable equivalent resistance. The compensated MOS resistor can provide a relatively stable resistance for a variety of analog circuit applications, such as a current reference.

8 Claims, 4 Drawing Sheets

MOS RESISTOR WITH SECOND OR HIGHER ORDER COMPENSATION

TECHNICAL FIELD

This invention relates to analog circuits.

BACKGROUND

Conventional analog circuits often incorporate voltage and/or current references. Examples of such analog circuits include resistor-capacitor (RC) oscillators and phase-locked loop (PLL) circuits. A bandgap voltage reference is a voltage reference circuit that is widely used in integrated circuits as a temperature-independent and process-independent voltage reference. A constant current reference, I, can be obtained using a bandgap voltage, Vbg, and a stable resistance R. The relationship between the current reference, I, the bandgap voltage, Vbg, and the resistance, R, is represented by I=Vbg/R.

A constant current reference is difficult to obtain in practice because of temperature and process variations that can affect the resistance R. For example, if a MOS resistor having resistance R is operated in an environment that is subject to varying temperature, then the resistance R can change when the temperature changes, resulting in a varying (i.e., non-constant) current reference. Similarly, variations in semiconductor manufacturing processes can yield resistors having varying resistances. For example, the resistances of poly-resistors produced by a stable manufacturing process can vary by around ±30%. Therefore, a current reference which is generated based on a resistance value R can vary with process and temperature variations.

One conventional solution for reducing resistor variation is to use a highly accurate external resistor (external to the integrated circuit chip). However, highly accurate external resistors are expensive and consume valuable layout area.

SUMMARY

A circuit arrangement (e.g., an integrated circuit) generates a second or higher order compensation voltage to compensate for variations in operation parameters (e.g., temperature and process variations). In one aspect, the compensation voltage is applied to a MOS resistor to compensate for mobility variations of the MOS resistor by maintaining a stable equivalent resistance. The compensated MOS resistor can provide a relatively stable resistance for a variety of analog circuit applications, such as a current reference.

DESCRIPTION OF DRAWINGS

Like reference symbols in the various drawings indicate like elements.

DETAILED DESCRIPTION

System Overview

Figure 1:
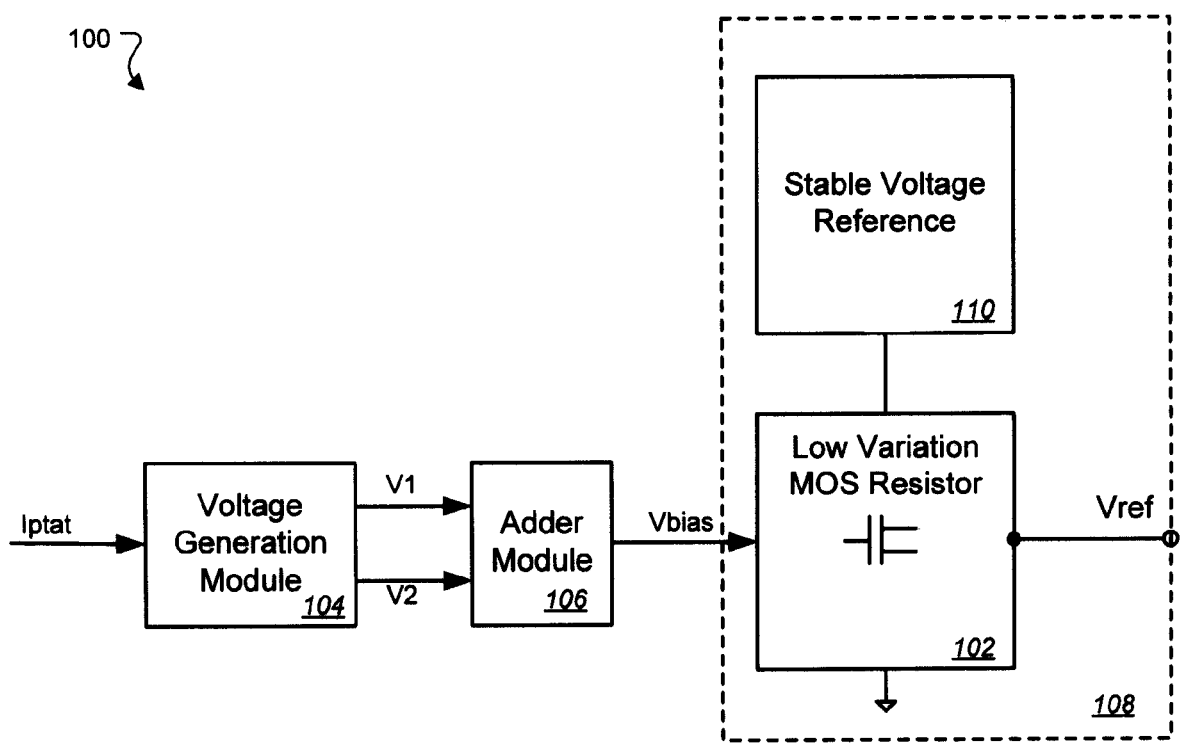
FIG. 1 is a block diagram of an example system for providing a low variation resistor.

FIG. 1 is a block diagram of an example system 100 for providing a low variation MOS resistor used as part of a constant current reference. In the depicted example, the system 100 includes a MOS resistor 102, a voltage generation module (VGM) 104 and an adder module 106. The VGM 104 receives a current that is proportional to absolute temperature T (Iptat) and provides a compensation voltage Vbias, to the MOS resistor 102. Iptat increases proportionally as absolute temperature increases. Vbias is generated using Iptat and is therefore a function of absolute temperature.

In the example circuit arrangement shown, the VGM 104 receives Iptat to generate two voltages V1 and V2. After receiving V1 and V2, the adder module 106 combines the voltages V1 and V2 to generate a bias voltage Vbias which can be applied to the MOS resistor 102. In some examples, Vbias is generated so that resistance variations (e.g., mobility variations) in the MOS resistor 102 are mitigated. Accordingly, the compensated MOS resistor 102 can provide a relatively stable resistance for a variety of analog circuits. For example, a constant current or voltage reference 108 can be constructed using a stable voltage reference 110 and the low variation MOS resistor 102.

In some implementations, the MOS resistor 102 is an equivalent MOS transistor (e.g., an n-type metal-oxide-semiconductor field-effect transistor (MOSFET)) operating in the triode region. MOS transistors have three regions of operation: cutoff, triode, and saturation. The triode region in a MOSFET is characterized by $V_{GS} > V_T$ and $V_{DS} < V_{DS,sat}$. The system 100 can generate Vbias as a gate voltage of the MOS resistor 102. By adjusting Vbias, the system 100 can compensate for variations of operation parameters of the MOS resistor 102. For example, a specific gate-source voltage (Vgs) generated by Vbias may be used to compensate the resistance variation in the MOS resistor 102 due to temperature variations.

Temperature variations in the MOS resistor 102 may affect a mobility parameter of the MOS resistor 102 in the triode region. As an illustrative example, suppose the MOS resistor 102 is an n-type MOSFET (NMOS). In triode region, an NMOS transistor is equivalent to a resistor with an equivalent resistance given by $$R_{eq} = \frac{1}{\mu \cdot Cox \cdot \frac{W}{L} \cdot (Vgs - Vt)}$$

where μ is the mobility of the NMOS, Cox is the capacitance of the NMOS, W/L is the width-to-length ratio of the NMOS, Vgs is the gate-source voltage of the NMOS, and Vt is the threshold voltage of the NMOS.

In the above equation, temperature variation in the NMOS resistor may affect the mobility μ and the threshold voltage Vt. Additionally, while capacitance Cox may be process-dependent, it is substantially independent of temperature. By adjusting the gate-source voltage Vgs, the temperature variation in the MOS resistor 102 can be compensated.

Vt in the above equation can be eliminated using the relation, Vgs=Vb+Vt where Vb is a bias voltage. The equivalent resistance of the NMOS resistor becomes $$R_{eq} = \frac{1}{\mu \cdot Cox \cdot \frac{W}{L} \cdot Vb}$$

Vb can be generated to compensate for the variation of the mobility μ to maintain a stable equivalent resistance $R_{eq}$. The variation of the mobility μ due to temperature can be expressed as $$\mu = \mu_0 \cdot \left(\frac{300}{T}\right)^{\frac{3}{2}},$$

where $\mu_0 = \mu(T=300\ K)$ and T is the absolute temperature.

To compensate for the temperature variation, in some implementations the compensation voltage Vb is generated to be approximately proportional to $T^{3/2}$. An approximation of a value that is proportional to $T^{3/2}$ can be obtained using a second order compensation approach. For example, a second order approximation of $T^{3/2}$ can be $K \cdot T^{3/2} \approx K1 \cdot T^2 + K2 \cdot T$, for a small interval of temperature T. In some implementations, the small interval of temperature, T, may be from −60° C. to 120° C. Note that higher order approximations are also possible.

In the circuit arrangement shown in FIG. 1, the VGM 104 generates the voltages V1 and V2, so that V1 is substantially proportional to T ($V_{ptat}$) and V2 is substantially proportional to $T^2$ ($V_{(ptat^2)}$). By combining V1 and V2, the adder module 106 can generate the compensation voltage Vbias, to mitigate variations in mobility parameters due to temperature variations affecting the MOS resistor 102.

Although a second order approximation scheme is implemented in the system 100, other (e.g., higher order) approximation schemes can also be used. In some implementations, the VGM 104 can generate more or less than two voltages. For example, the VGM 104 can generate an additional voltage V3. The voltage V3 may be related to a voltage proportional to $T^3$ ($V_{(ptat^3)}$). The adder module 106 may then be modified to combine three voltages into the compensation voltage Vbias. In some examples, a more accurate compensation voltage can be generated to maintain equivalent resistance of the MOS resistor 102. In another example where less accuracy can be tolerated, only V1 may be used as the compensation voltage. In such a circuit arrangement the adder module 106 may be removed.

Example Functional Block Diagram

Figure 2:
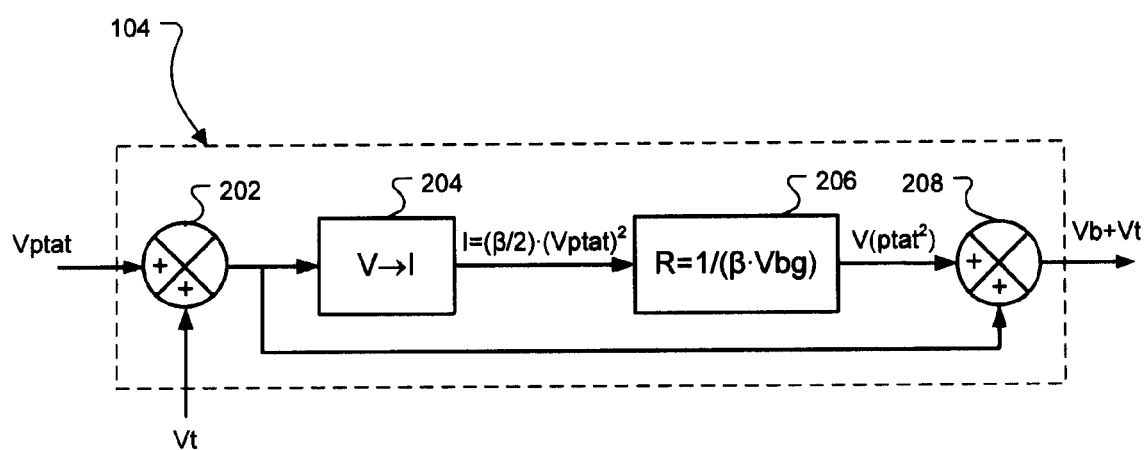
FIG. 2 is a functional block diagram of an example compensation voltage generation system.

FIG. 2 is a functional block diagram of one embodiment of voltage generation module 104 shown in FIG. 1. The voltage generation module 104 can be implemented in the system 100 to generate a compensation voltage for MOS resistor 102 shown in FIG. 1 (e.g., an NMOS device). The voltage generation module 104 includes a first voltage adder block 202, a voltage-to-current (V-to-I) block 204, a resistor block 206, and a second voltage adder block 208. The voltage generation module 104 can use a proportional to absolute temperature voltage ($V_{ptat}$) and a threshold voltage (Vt) to generate a compensation voltage (Vb+Vt) to compensate the temperature variation of the mobility μ.

The compensation voltage generation system 200 combines $V_{ptat}$ and Vt using the first voltage adder block 202. For example, the first voltage adder block 202 adds the voltage levels of $V_{ptat}$ and Vt. The combined voltage is received by the V-to-I block 204 and the second voltage adder block 208.

In some implementations, the V-to-I block 204 generates a current using a MOS transistor in the saturation region. As shown, the generated current can be expressed as $$I = \frac{\beta}{2} \cdot (V_{ptat})^2.$$

The generated current is received by the resistor block 206. In some implementations, the resistor block 206 includes a MOS resistor that is biased with a bandgap voltage (Vbg). The resistor block 206 can generate a voltage ($V_{(ptat^2)}$) that is approximately proportional to $T^2$. For example, $$V_{(ptat^2)} = A \cdot \frac{(V_{ptat})^2}{Vbg},$$

where A is a constant coefficient. For example, A can be related to a size ratio between two or more devices for generating $V_{(ptat^2)}$. Examples of A are described with reference to FIG. 3.

After generating $V_{(ptat^2)}$, the compensation voltage generation system 200 can generate the gate-source voltage (Vb+Vt) by combining $V_{(ptat^2)}$ and $V_{ptat}$. In one example, the NMOS device can use the gate-source voltage (Vb+Vt) to compensate the temperature variation of the mobility μ, resulting in a very low variation MOS resistor.

Example Circuit Arrangement

Figure 3:
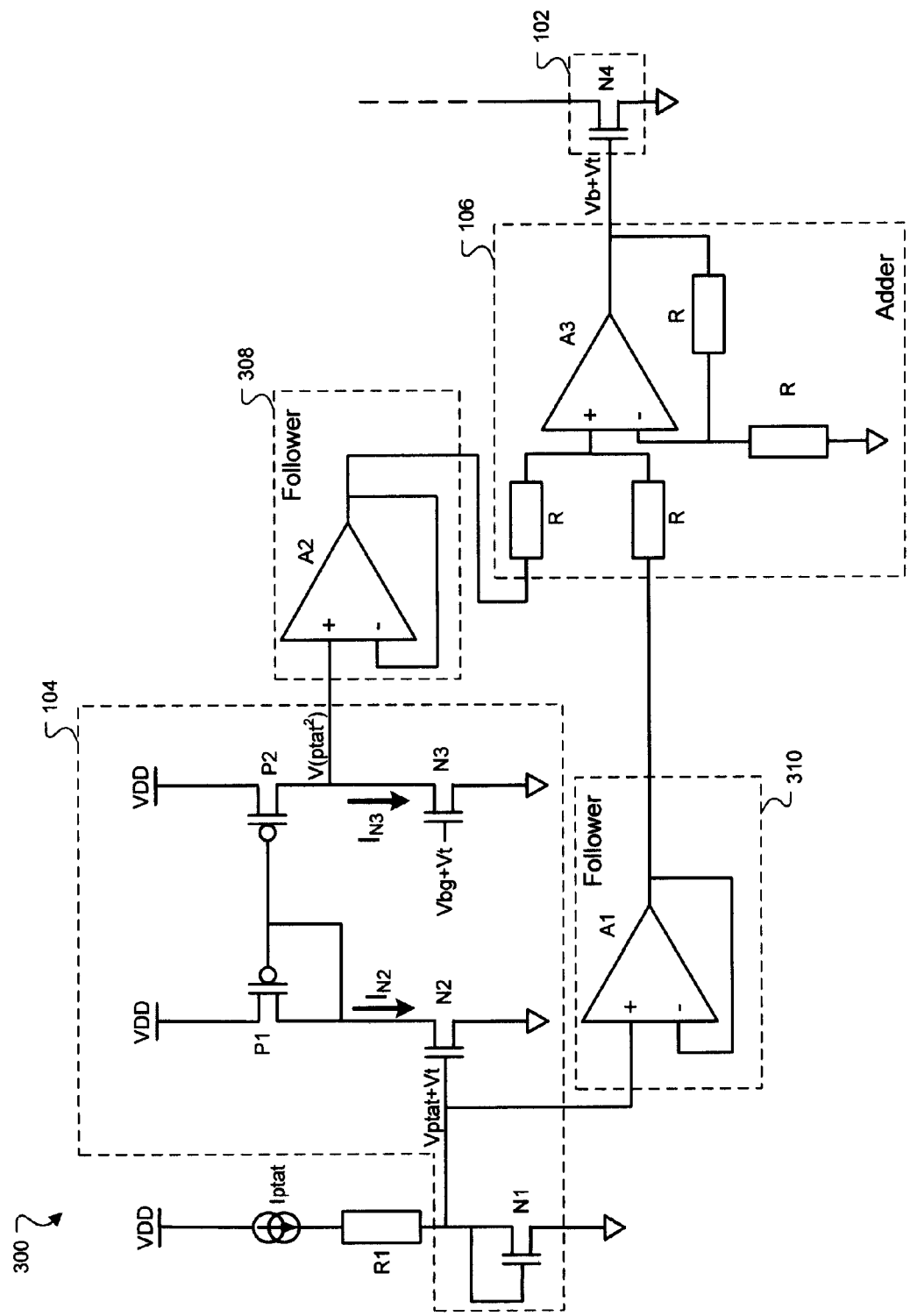
FIG. 3 is a schematic diagram of an example circuit arrangement for compensating resistance of a MOS resistor for temperature and process variations.

An example circuit arrangement of the system 100 is shown in FIG. 3. The example circuit arrangement 300 includes a MOS resistor 102, a voltage generation module 104, an adder module 106, and two follower modules 308, 310. The circuit 300 can operate at a low voltage supply (e.g., at VDD=1.25V). For example, the VDD can be substantially 1.2 V.

The circuit 300 receives Iptat as an input from a current source 312 (e.g., a transistor or resistor current source, a current mirror, a Widlar or Wilson current source). Iptat may be generated according to the equation $$I_{ptat} = \frac{Ut \cdot \ln(n)}{R0}$$

where $$Ut = \frac{k \cdot T}{q}$$

and n (a sizing ratio), R0 (an internal resistance of the current source 312), k, and q are constants, where k is Boltzmann's constant and q is the magnitude of the electrical charge (in coulombs) on the electron.

The voltage generation module 104 includes NMOS transistors N1, N2, and N3. In this example, N1 is a diode controlling direction of current flow and N2 is operating in the saturation region to control current $I_{N2}$ based on a received gate voltage $V_{ptat}+Vt$. In operation, N3 is operating in triode region. For example, a drain-source voltage of N3 may be less than a difference between a gate-source voltage and a threshold voltage of N3. The voltage generation module 104 also includes two (p-type MOSFET) PMOS transistors P1 and P2. As shown, P1 and P2 are arranged in a current mirror structure. For example, a drain-source current $I_{N2}$ flowing into N2 is substantially the same as a drain-source current $I_{N3}$ flowing into N3.

The voltage generation module 104 generates a first voltage $V_{ptat}+Vt$ and a second voltage $V_{(ptat^2)}$ using the Iptat input. For example, the first voltage can be generated using the NMOS transistors N1 and N2. As shown, the first voltage is obtained as the gate-source voltage of N2 ($Vgs_{N2}$). In the depicted example, $Vgs_{N2}$ is given by the relation $$Vgs_{N2} = R1 \cdot I_{ptat} + Vgs_{N1} = \frac{R1 \cdot Ut \cdot \ln(n)}{R0} + Vgs_{N1},$$

where $Vgs_{N1}$ is a gate-source voltage of N2.

Note that the voltage $$\frac{R1 \cdot Ut \cdot \ln(n)}{R0}$$

is proportional to temperature T. Also, $Vgs_{N1} \approx Vt$ because the size of N1 is large. By substituting $Vgs_{N1}=Vt$ and $$\frac{R1 \cdot Ut \cdot \ln(n)}{R0} \approx V_{ptat}$$

in the above equation, the gate-source voltage of N2 can be expressed as the relation $Vgs_{N2}=V_{ptat}+Vt$ The second voltage is generated at the drain terminal of N3. Due to the current mirror structure of P1 and P2, a drain-source current of N3 ($I_{N3}$) is substantially the same as the drain source current of N2 ($I_{N2}$). A value of $I_{N2}$ can be obtained by $$I_{N2}=\mu \cdot Cox/2 \cdot |W/L|_{N2} \cdot (V_{ptat})^2$$

Because N3 is operating in the triode region, the gate-source voltage of N3 is $Vbg+Vt$. Therefore, the drain voltage of N3 can be obtained by $$Vd_{N3}=I_{N2} \cdot R_{N3}=(\mu \cdot Cox/2 \cdot |W/L|_{N2} \cdot (V_{ptat})^2)/\mu \cdot Cox \cdot |W/L|_{N3} \cdot Vbg = |W/L|_{N2} \cdot |W/L|_{N3} \cdot (V_{ptat})^2/Vbg = A \cdot (V_{ptat})^2/Vbg = V_{(ptat^2)}$$

As shown in the above equation, A is related to a half of a ratio between the size of N2 and the size of N3 (e.g., $A=|W/L|_{N2}/2 \cdot |W/L|_{N3}$). In some implementations, the size of the NMOS devices N2 and N3 can be specifically designed and manufactured to adjust the response of the output voltage $V_{(ptat^2)}$.

The follower modules 308, 310 receive the first voltage $V_{ptat}+Vt$ and the second voltage $V_{(ptat^2)}$, respectively. In one implementation, the follower module 308 includes an operational amplifier A1, and the follower module 310 includes an operational amplifier A2. In some implementations, the follower modules 308, 310 can use the operational amplifiers A1 and A2, respectively, to compensate voltage mismatch of the received voltages $V_{ptat}+Vt$ and $V_{(ptat^2)}$.

In one implementation, the adder module 106 includes an operational amplifier A3 and four substantially identical resistors R. In this example, the adder module 106 receives output currents from the follower modules 308, 310. In some implementations, the adder module 106 generates an output voltage that is the sum of the gate-source voltage of N2 and the drain voltage of N3.

The MOS resistor 102 includes a NMOS transistor N4 to receive the output voltage from the adder module 106. In this example, the output voltage is received at the gate terminal of N4. As a result, $Vgs_{N4}=Vb+Vt=V_{ptat}+V_{(ptat^2)}+Vt$.

In operation, N4 is operating in the triode region. Therefore, the equivalent resistance of N4 can be computed using $$R_{N4} = \frac{1}{\mu \cdot Cox \cdot \left.\frac{W}{L}\right|_{N4} \cdot (Vgs_{N4} - Vt)} = \frac{1}{\mu \cdot Cox \cdot \left.\frac{W}{L}\right|_{N4} \cdot Vb}$$

Additionally, the change in the equivalent resistance with respect to temperature is $$\frac{\partial R_{N4}}{\partial T} \approx 0$$

because the mobility variation is compensated by the variation in Vb. In some applications, the MOS resistor 102 can be connected to a constant voltage source to generate a constant current reference.

The MOS resistor 102 is stable with respect to temperature and VDD. In some examples, the peak to peak variation of the MOS resistor 102 can be approximately 0.5%. The resistance of the MOS resistor 102 may depend on Cox variation. However, the Cox parameter is well controlled. In some applications (e.g., in an oscillator application), process-dependence of the MOS resistor 102 may be reduced. The MOS resistor 102 is a highly precise resistor. For example, the total variation of the MOS resistor 102 may be around ±5% due to Cox variation. Furthermore, the circuit 300 can be fully integrated to reduce cost.

In some implementations, the MOS resistor 102 may include more than one NMOS transistors. For example, the MOS resistor 102 may include a combination of two, three, four, or more NMOS transistors in series and/or in parallel. In one example, the MOS transistor 102 may include a second NMOS transistor N5 having a source terminal connected to the drain terminal of N4. For example, N5 may receive a Vgs of Vb+Vt. In another example, the MOS resistor 102 may include additional NMOS transistors in parallel with N4. For example, the additional NMOS transistors may be in other branches of the circuit 300 and receive Vb+Vt at the gate terminals while having their source terminals connected to ground. In some examples, the gate voltage Vb+Vt can reduce temperature variations of the equivalent resistance of the NMOS transistors.

Example Process

Figure 4:
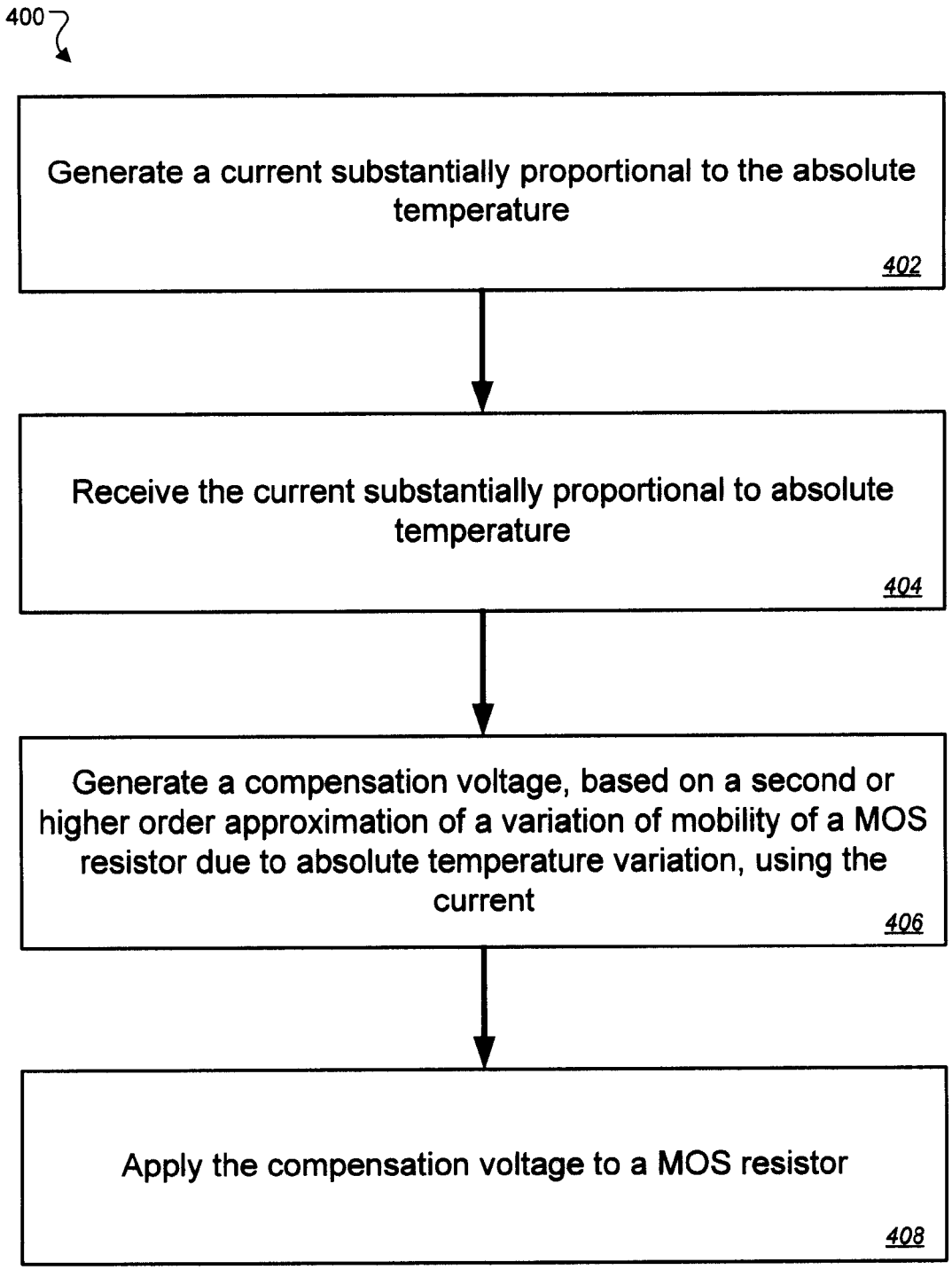
FIG. 4 is a flow diagram of an example process for compensating the resistance of a MOS resistor for temperature and process variations.

FIG. 4 is a flow diagram of an example process 400 for compensating the resistance of a MOS resistor (e.g., the MOS resistor 302 in FIG. 3) for temperature and process variations. Some or all the steps of the method 400 can be performed by a circuit (e.g., the system 100 in FIG. 1 or the circuit 300 in FIG. 3), for example.

The method 400 begins by generating a current substantially proportional to the absolute temperature (402). For example, the system 100 receives a current substantially proportional to the absolute temperature (Iptat). In some implementations, Iptat may be generated according to the equation $$I_{ptat} = \frac{Ut \cdot \ln(n)}{R0}$$

where $$Ut = \frac{k \cdot T}{q}$$

and n (a sizing ratio), R0 (an internal resistance of the current source 312), k, and q are constants, where k is Boltzmann's constant and q is the magnitude of the electrical charge (in coulombs) on the electron.

Next, the method 400 includes receiving the current substantially proportional to the absolute temperature (404). In one example, the current substantially proportional to the absolute temperature is received by the voltage generation module 104. In another example, the circuit 300 receives the current Iptat at a terminal of the resistor R1.

After receiving the current, the method 400 includes generating a compensation voltage, based on, for example, a second or higher order approximation of a variation of mobility of a MOS resistor due to absolute temperature variation, using the current (406). In one example, the voltage generation module 104 and the adder module 106 can generate a bias voltage Vbias based on the received current Iptat. In another example, the circuit 300 can use the Iptat to generate a compensation voltage Vb+Vt to the MOS resistor 102. In an implementation shown in FIG. 3, Vb+Vt=$V_{ptat}$+$V_{(ptat^2)}$+Vt. In some implementations, the generated compensation voltage is approximately proportional to $T^{3/2}$, where T is the absolute temperature. For example, a combination of the $V_{ptat^2}$ and $V_{(ptat^2)}$ is a second order approximation of $T^{3/2}$. For example, K·$T^{3/2}$≈K1·$T^2$+K2·T, where K, K1, and K2 are constant coefficients.

The method 400 includes applying the compensation voltage to a MOS resistor (408). For example, the system 100 can apply the Vbias to the low variation MOS resistor 102. In some examples, the compensation voltage can substantially reduce the process and temperature variations in the MOS resistor 102. In some implementations, the MOS resistor 102 can be used to generate a current or voltage reference that is substantially constant over a range of temperature.

A number of implementations of the invention have been described. Nevertheless, it will be understood that various modifications may be made without departing from the spirit and scope of the invention. Accordingly, other implementations are within the scope of the following claims.

What is claimed is:

1. An integrated circuit arrangement, comprising:
   a current source operable to generate a current which is substantially proportional to absolute temperature;
   a voltage generation circuit coupled to receive the current and operable to use the current to generate a first voltage and a second voltage; and
   a voltage adder circuit coupled to the voltage generation circuit and operable to add the first voltage and the second voltage to generate a compensation voltage based on a second order approximation of a variation of mobility of a metal-oxide-semiconductor (MOS) resistor due to absolute temperature variation, the compensation voltage being capable to cause the MOS resistor to operate in a triode region.

2. The integrated circuit arrangement of claim 1, further comprising:
   a MOS resistor having a gate terminal coupled to receive the compensation voltage.

3. The integrated circuit arrangement of claim 1, wherein the compensation voltage causes resistance between source and drain terminals of the MOS resistor to remain substantially constant over a range of temperature.

4. The integrated circuit arrangement of claim 1, wherein the circuit arrangement forms a monolithic fully integrated circuit.

5. The integrated circuit arrangement of claim 1, wherein the compensation voltage further causes the resistance between source and drain terminals of the MOS resistor to remain substantially constant despite differences in current flows in the circuit arrangement due to process variations.

6. The integrated circuit arrangement of claim 1, wherein the first voltage is substantially equal to the sum of a threshold voltage and a voltage that is proportional to absolute temperature, and the second voltage is substantially equal to a square of the voltage that is proportional to absolute temperature.

7. The integrated circuit arrangement of claim 1, further comprising:
   a first follower circuit operable for coupling the first voltage to the voltage adder circuit; and
   a second follower circuit operable for coupling the second voltage to the voltage adder circuit.

8. The integrated circuit arrangement of claim 7, wherein the first or second follower circuit further comprises:
   an operational amplifier having a negative input terminal coupled to its output terminal and a positive input coupled to the first or second voltage.

* * * * *

UNITED STATES PATENT AND TRADEMARK OFFICE
CERTIFICATE OF CORRECTION

PATENT NO. : 7,719,341 B2  Page 1 of 1
APPLICATION NO. : 11/924516
DATED : May 18, 2010
INVENTOR(S) : Jimmy Fort It is certified that error appears in the above-identified patent and that said Letters Patent is hereby corrected as shown below:

Column 2, Line 35 in the Specification; replace:
"MOSFET is characterized by $V_{GS} > V_T$ and $V_{DS} < V_{DS,sat}$, The" with
-- MOSFET is characterized by $V_{GS} > V_T$ and $V_{DS} < V_{DS,sat}$. The --

Column 5, Line 32 in Specification; replace:
" $\frac{R1 \cdot Ut \cdot \ln(n)}{R0} \approx V_{ptat}$ " with -- $\frac{R1 \cdot Ut \cdot \ln(n)}{R0} = V_{ptat}$ --

Column 5, Line 39 in the Specification; replace:
"expressed as the relation $Vgs_{N2} = V_{ptat} + Vt$" with
-- expressed as the relation $Vgs_{N2} = V_{ptat} + Vt$. --

Column 5, Lines 50-53 in the Specification; replace:
" $Vd_{N3}=I_{N2} \cdot R_{N3}=(\mu \cdot Cox/2 \cdot |W/L|_{N2} \cdot (V_{ptat})^2)/\mu \cdot Cox \cdot |W/L|_{N3} \cdot Vbg = |W/L|_{N2} 2 \cdot |W/L|_{N3} \cdot (V_{ptat})^2 / Vbg = A \cdot (V_{ptat})^2 / Vbg = V_{(ptat^2)}$ " with $$Vd_{N3} = I_{N2} \cdot R_{N3} = \frac{\left(\frac{\mu \cdot Cox}{2} \cdot \left|\frac{W}{L}\right|_{N2} \cdot (V_{ptat})^2\right)}{\mu \cdot Cox \cdot \left|\frac{W}{L}\right|_{N3} \cdot Vbg} = \frac{\left|\frac{W}{L}\right|_{N2}}{2 \cdot \left|\frac{W}{L}\right|_{N3}} \cdot \frac{(V_{ptat})^2}{Vbg} = A \cdot \frac{(V_{ptat})^2}{Vbg} = V_{(ptat^2)}.$$

-- --

Signed and Sealed this

Thirteenth Day of July, 2010

David J. Kappos
*Director of the United States Patent and Trademark Office*